United States Patent [19]
Lowenstein et al.

[11] Patent Number: 5,365,164
[45] Date of Patent: Nov. 15, 1994

[54] HARMONIC ANALYZER AND METHODS OF CONSTRUCTING AND UTILIZING SAME

[75] Inventors: Michael Z. Lowenstein, Mequon; Dean R. Mehlberg, Hales Corners, both of Wis.

[73] Assignee: TCI (Trans-Coil, Inc.), Milwaukee, Wis.

[21] Appl. No.: 934,866

[22] Filed: Aug. 24, 1992

[51] Int. Cl.$^5$ .............................................. G01R 21/06
[52] U.S. Cl. ................ 324/76.21; 324/77.11; 324/115; 324/520; 324/623; 340/658; 364/485
[58] Field of Search ............... 364/485, 483; 340/658; 324/520, 623, 76.21, 77.11, 115

[56] References Cited
U.S. PATENT DOCUMENTS

| | | | |
|---|---|---|---|
| 4,818,947 | 4/1989 | Zucker | 324/520 |
| 4,902,960 | 2/1990 | Lowenstein | 324/621 |
| 5,061,890 | 10/1991 | Longini | 324/107 |
| 5,072,187 | 12/1991 | Shilo | 324/623 |
| 5,170,114 | 12/1992 | Lowenstein | 324/128 |
| 5,212,441 | 5/1993 | McEachern | 324/142 |

Primary Examiner—Kenneth A. Wieder
Assistant Examiner—Jose M. Solis
Attorney, Agent, or Firm—Irving M. Weiner; Joseph P. Carrier; William F. Esser

[57] ABSTRACT

An apparatus for the analysis of power quality and the effects of harmonic distortions on machinery or equipment. The apparatus is compact, portable, and non-invasive in that the apparatus can be operatively connected to an electrical carrier without power interruption. A display device is built in allowing graphical display of averaged or continuously updated measurements and analysis. A central processing unit analyzes measurements using Fourier analysis.

4 Claims, 4 Drawing Sheets

HARMONIC ANALYZER AND METHODS OF CONSTRUCTING AND UTILIZING SAME

BACKGROUND OF THE INVENTION

1. Field of the Invention

The present invention relates to an apparatus for evaluating the power quality in an electrical carrier. More particularly, the apparatus of the present invention comprises a non-invasive, hand-held, portable device for measuring and graphically displaying harmonic distortions in an electrical waveform which may negatively affect machinery connected thereto.

The amount of electric power used by machinery and the machinery itself can be affected by the harmonic distortions present in a power system. Elimination or control of the distortions may provide a substantial cost savings with respect to electrical consumption, and a cost savings with respect to machinery failure and repair or replacement. Thus, measuring and evaluating the harmonic distortions in electrical carriers can result in a substantial cost savings for power users.

2. Description of the Relevant Art

The present invention overcomes the many disadvantages and difficulties associated with known analyzers. The known devices fail to provide a truly portable, hand held, simple-to-use device with a multitude of displays for quickly and easily measuring and analyzing harmonic distortions in power systems.

SUMMARY OF THE INVENTION

The present invention may suitably comprise an apparatus for determining, measuring, analyzing, and displaying the harmonic distortions in an electric carrier such as a power line.

In a preferred embodiment, the apparatus of the present invention comprises a device including a housing sized to be hand-held. The apparatus includes an internal power source. The display means of the apparatus produces graphical representations of the harmonic data collected, including bar graphs and voltage or current versus time graphs. The input means of the apparatus is non-invasive permitting collection of data without disconnection or interruption of the power system, the machinery, or other equipment.

It is an object of the present invention to provide a novel power system analyzer.

It is a further object to provide a compact, hand-held, portable harmonic measurement apparatus.

It is a still further object of the present invention to provide an apparatus with display means capable of providing averaged or continuously updated graphical representations of the collected data.

It is a still further object of the present invention to provide an apparatus which measures true RMS values of voltage and current, and performs high-speed Fourier analysis of such measurements.

The above and further objects, details, and advantages of the invention will become apparent from the following detailed description when read in conjunction with the accompanying drawings.

DETAILED DESCRIPTION OF THE PREFERRED EMBODIMENT

Figure 1:
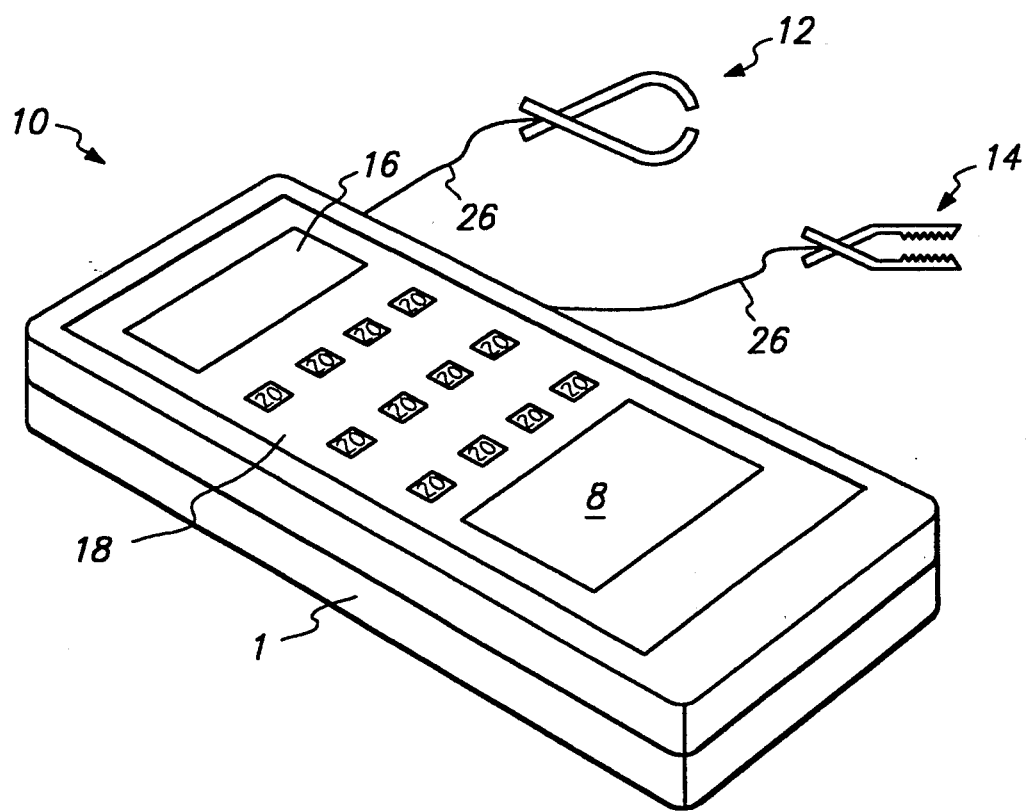
FIG. 1 illustrates a perspective view of an apparatus in accordance with the present invention.

As shown in FIG. 1, an apparatus 10 for evaluating power quality includes preferably, but not necessarily, detachable input means 12, 14 and a housing 1 which preferably, but not necessarily, is compact and/or is able to be held in a user's hand. Input means 12, 14 operatively connects to apparatus 10 by input ports (not shown) and releasable connectors (not shown). An internal power source 24, preferably comprising batteries, is provided within the housing. The apparatus includes a display means 16, preferably comprising a liquid crystal display (LCD). A keypad 18 comprising a plurality of keys 20 is provided to select functions, the type of display, and to turn the apparatus 10 on aped off. Preferably the housing 1 and the apparatus 10 further include an outlet port 22 (best seen in FIG. 2) for connection to a printer (not shown) and/or a computer (not shown). The housing 1 includes preferably, but not necessarily, an instruction area 8 to which printed matter may be secured for a quick reference guide for the operator.

Input means 12 preferably comprises a clamp-on current transformer for current measurement in an electrical carrier without breaking electrical connections. A 0-1000 amp transformer is preferable with optional 0-150 and 0-3000 amp transformers available. The clamp-on input means 12 encircles the electrical carrier.

Input means 14 preferably comprises spring-loaded clip members for engaging an electrical connection in the power system to be analyzed.

Each input means 12, 14 operatively connects to the apparatus by wires 26 and male/female connectors (not shown) at the end of the wires opposite the respective input means.

The apparatus 10 measures "true" values of voltage and current by calculating the Root Mean Square (RMS) value of the input signal. The measured data or input signal can be gathered in a "single-shot" mode consisting of measurements averaged over 4 cycles of the AC power or in a "free-run" mode consisting of continuously updated measurements. The "single-shot" mode provides the greatest accuracy whereas the "free-run" mode allows observation of changing data during changing loads on a continuously updated basis. The "free-run" mode updates measurements every one-half second. The desired mode ("single-shot" or "free-run") may be chosen by selecting a designated key 20 on keypad 18.

The relative amplitude of each harmonic 1-19 in the preferred fore may be shown on display means 16 by repeated operation of a designated key 20 on keypad 18. The absolute value of each harmonic 1-19 in the preferred fore may be shown on display means 16 by further repeated operation of a designated key 20 on keypad 18.

Other key 20 operations include in the preferred form, but are not limited to, an "on" key, an "off" key, a "volts" key, an "amps" key, a "null" key, a "wave" key, a "graph" key, and a "total harmonic distortion (THD)" key. In the preferred configuration single functions are selected by single keys. However multiple functions my be selected by a single key using timed or multiple operation, or may be selected by simultaneous operation of various key combinations.

Figure 2:
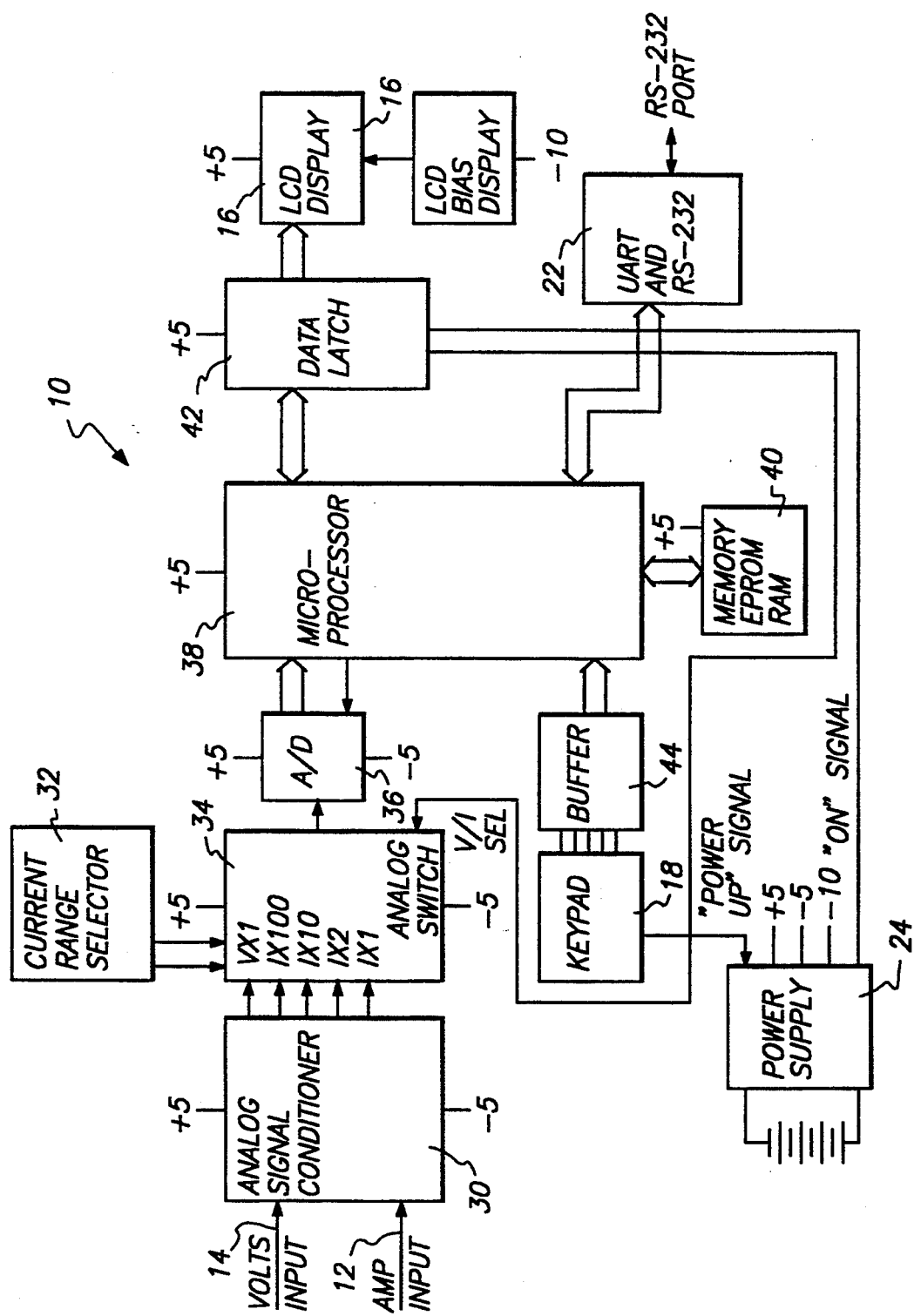
FIG. 2 illustrates a block diagram of the circuit of the apparatus as shown in FIG. 1.
Figure 4:
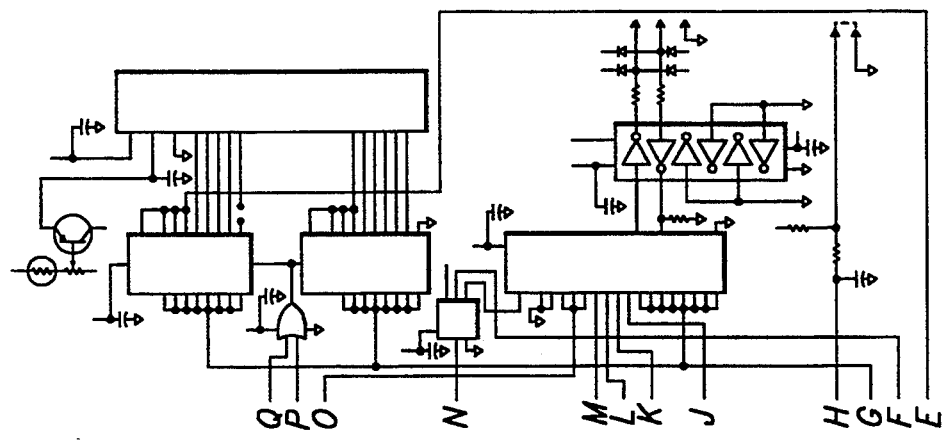
FIGS. 3—6 illustrate schematic diagrams of the circuit in accordance with the present invention.
Figure 3:
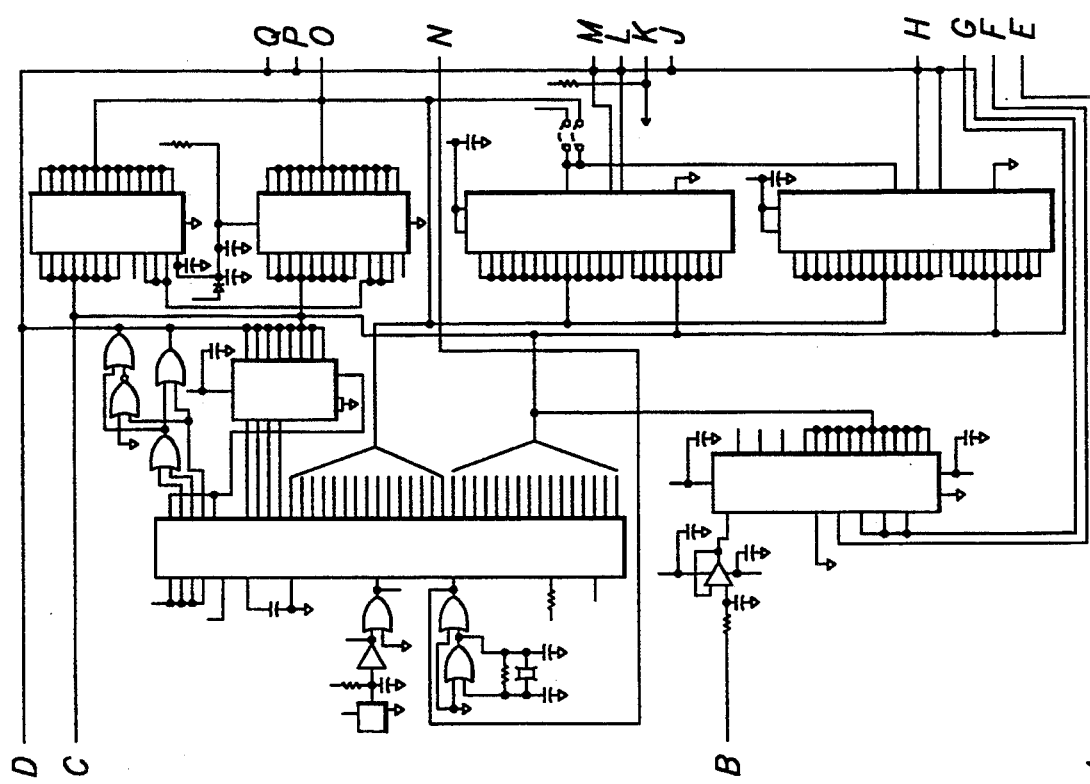
Figure 5:
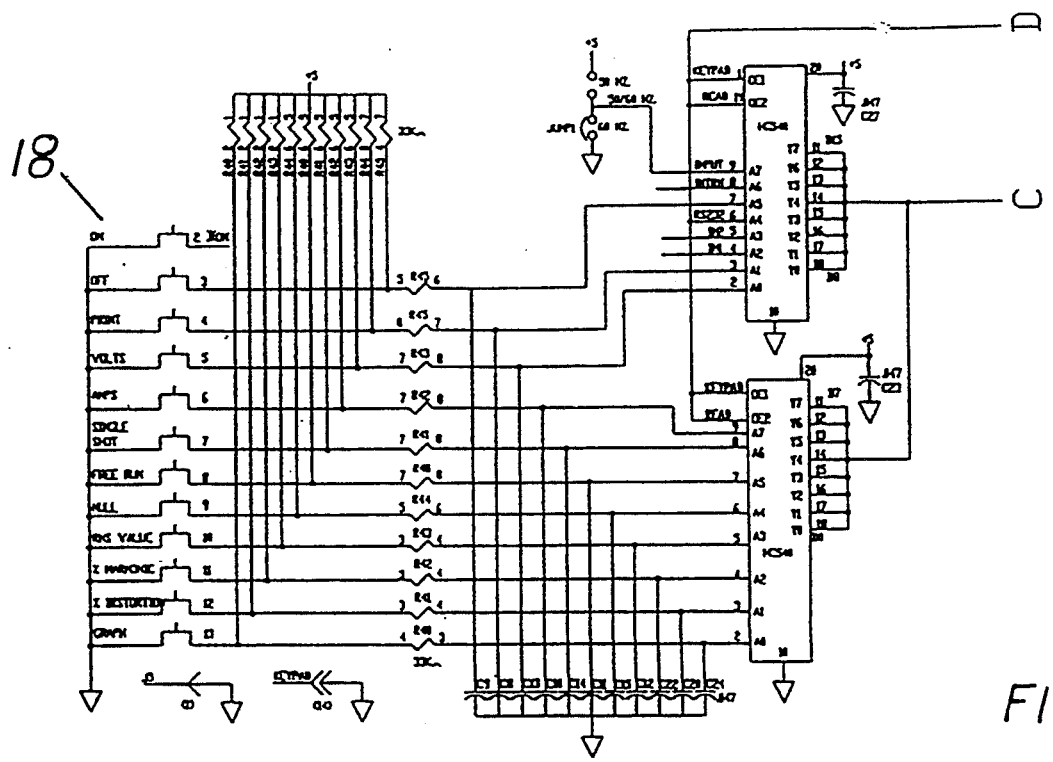
Figure 6:
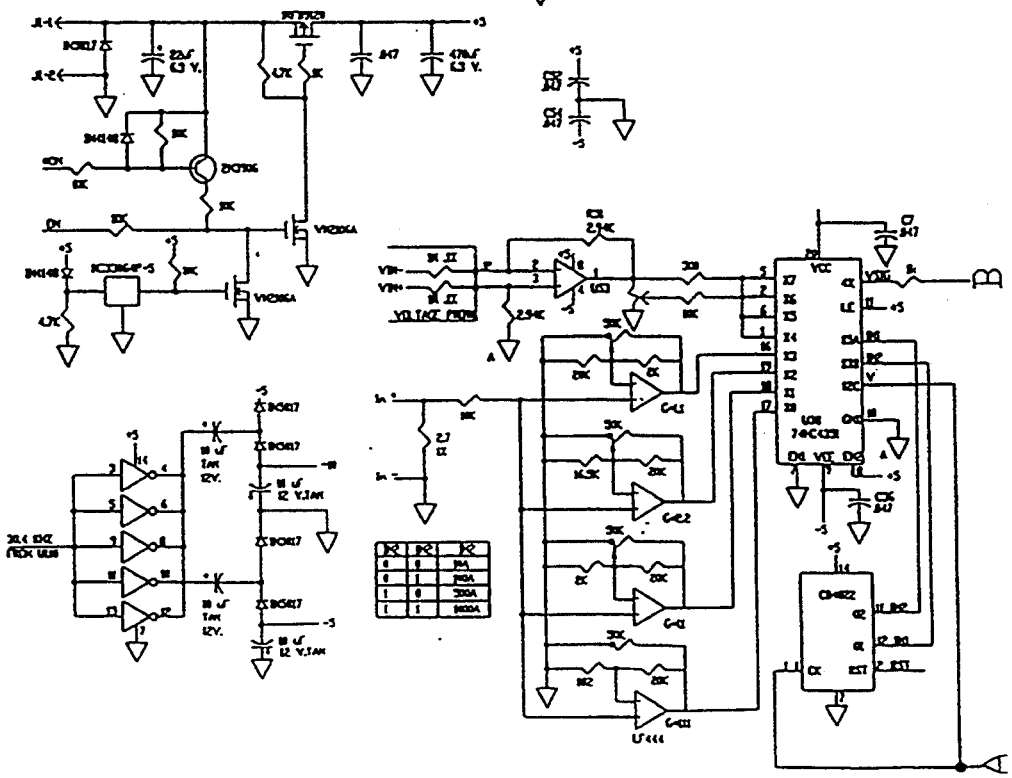

As seen in FIG. 2, the block diagram shows a simplified interpretation of the construction of the apparatus 10. The input means 12, 14 generate an input signal which is supplied to a signal conditioner 30. The signal conditioner 30 includes a built-in voltage divider to ensure that the internal components of apparatus 10 and the operator are not subjected to more than five volts. This ensures the safety of the operator and the durability of the internal components of the apparatus 10.

An analog/digital converter 36 is provided to convert the analog input signal to an appropriate digital signal that can be used in digital-signal processing.

The conditioned or converted signal is then processed by a CPU or microprocessor 38 which performs Fourier analysis on the data of the converted or conditioned signal. The CPU or microprocessor 38 utilizes a program or software stored in an erasable programmable read only memory (EPROM) device 40. Fourier analysis comprises the fitting of terms of a Fourier series to periodic data wherein a Fourier series comprises an infinite series in which the terms are constants multiplied by sine or cosine functions of integer multiples of the variable and which is used in the analysis of periodic functions.

It is possible to alter the copyrighted software to meet a particular circumstance or data measurement requirement. In addition, modified or "upgraded" functions are possible.

A non-volatile memory 42 for data is provided to retain the last measurements when apparatus 10 is turned off. When apparatus 10 is turned on again, the memory 42 is recalled and the stored data made available to the user. This memory is only non-volatile so long as the batteries retain their charge. To enable battery changing, an internal capacitor maintains the memory 42 for a period of two minutes. However, should the batteries become depleted without new batteries being inserted within two minutes of depletion, the data in memory 42 will be lost.

A buffer 44 is preferably included between the keypad 18 and CPU 38 to increase or amplify the load current or fanout capability.

FIGS. 3-6 illustrate sectional views of a detailed schematic of the main circuit of the apparatus 10 shown in the block diagram of FIG. 2. The frequency of the apparatus 10 is locked at 60 Hz (50 Hz optional). The current ranges of the apparatus 10 are (in amps) 0-10, 100, 500, 1000. The total harmonic distortion range (THD) is 0-999% of fundamental. The bar-graph displays harmonics over a range of 0-125% of fundamental.

In use the apparatus 10 would preferably, but not necessarily, be operatively connected to a conductor and measurements taken with and without equipment and/or machinery operating. on the basis of the data retrieved, a course of action can be suggested to the user to improve the overall power quality and reduce interference.

Although there has been described what is at present considered to be a preferred embodiment of the invention, it will be understood that various modifications and variations may be made therein, and it is intended to cover in the appended claims all such modifications as fall within the true spirit and scope of the invention.

We claim:

1. An apparatus for determining and displaying the harmonic distortions which may be found in an electrical carrier affecting the power quality, comprising:

input means for operatively connecting said apparatus to said electrical carrier and generating an analog input signal;

an analog to digital convertor to produce a digital signal;

a central processing unit for analyzing said digital signal utilizing Fourier analysis and generating mathematically quantifiable harmonic data for a plurality or harmonics of said analog input signal substantially concurrently;

display means for graphically showing in averaged or continuously updated form said harmonic data;

an input signal conditioner provided between said input means and said central processing unit;

said display means is capable of showing absolute values of current or voltage, showing RMS values of current or voltage, showing total harmonic distortion, showing a graph of the percent fundamental voltage or current versus harmonic number, and showing the voltage or current waveform versus time; and said apparatus is portable and hand-held.

2. The apparatus of claim 1, wherein:

said apparatus includes keypad means operatively connected to said central processing unit for selection of functions and displays.

3. The apparatus of claim 1, wherein:

said apparatus further includes memory means for retaining the last said harmonic data when said apparatus is switched off in a "single-shot" mode.

4. The apparatus of claim 1, wherein:

said apparatus includes a software switched output means for connection to a printing means or connection to a computer.

* * * * *

UNITED STATES PATENT AND TRADEMARK OFFICE
CERTIFICATE OF CORRECTION

PATENT NO. : 5,365,164
DATED : November 15, 1994
INVENTOR(S) : Lowenstein et al.

It is certified that error appears in the above-indentified patent and that said Letters Patent is hereby corrected as shown below:

Column 2, line 18, change "aped" to --and--;
Column 2, line 54, change "fore" to --form--;
Column 2, line 57, change "fore" to --form--;
Column 2, line 66, change "my" to --may--.

Signed and Sealed this

Seventeenth Day of January, 1995

*Attest:*

BRUCE LEHMAN

*Attesting Officer*            *Commissioner of Patents and Trademarks*